United States Patent [19]

Pearce

[11] 4,090,146

[45] May 16, 1978

[54] CLIPPING INDICATOR CIRCUIT FOR TRANSISTOR AMPLIFIER

[75] Inventor: Daniel Scott Pearce, Lancaster, N.Y.

[73] Assignee: GTE Sylvania Incorporated, Stamford, Conn.

[21] Appl. No.: 811,322

[22] Filed: Jun. 29, 1977

[51] Int. Cl.² ............................................. H03F 17/00
[52] U.S. Cl. ........................................... 330/2; 330/59
[58] Field of Search ................. 330/2, 59, 207 P, 298; 340/248 C, 248 Z

[56] References Cited

U.S. PATENT DOCUMENTS 3,953,806  4/1976  Veranth .................................... 330/2

*Primary Examiner*—James B. Mullins

*Attorney, Agent, or Firm*—Norman J. O'Malley; Theodore D. Lindgren; Robert T. Orner

[57] ABSTRACT

A light-indicator circuit is disclosed which permits visual indication of clipping caused by the over-driving of a transistor amplifier. The circuit includes a light-emitting diode connected in parallel with the collector-emitter path of a switching transistor which is biased to conduct during low-signal-level operation of the amplifier. The switching transistor is caused to switch to its non-conducting state when the amplifier is overdriven, thereby activating the light-emitting diode. Means may be provided to delay switch-back once activation of the light-emitting diode has occurred. Means may be provided to inhibit activation of the circuit by over-driving signals of limited duration.

7 Claims, 2 Drawing Figures

CLIPPING INDICATOR CIRCUIT FOR TRANSISTOR AMPLIFIER

BACKGROUND OF THE INVENTION

The present invention relates to apparatus for indicating clipping and near-clipping operation of a signal amplifying transistor operating in an amplifier circuit.

Overdriving of a signal-amplifying transistor results in clipping of signal peaks, thereby distorting the shape of the output signal in relation to that of the input signal. Clipping of audio signals is particularly objectionable to those persons who enjoy true reproduction of sound signals, whether said signals originate in live or recorded form. Very often, the unskilled operator of audio equipment is unaware of the fact that adjustment of a volume control to a higher level does not necessarily increase the volume or power output and that said adjustment often causes clipping which drastically alters the tone quality and the harmonic content of the input signal. In other circumstances, a skilled operator of audio equipment often desires to maximize output power while at the same time minimizing distortion.

Broadcast audio equipment and certain high-quality home audio equipment utilize meters which indicate by moving needle position the instantaneous power of the audio output, thus permitting the operator to adjust the volume to optimize needle peaking and minimize overdriving of output amplifiers. Meters, however, are not generally used on home audio equipment because of the expense and repair associated therewith.

In addition to the aforementioned meters, another method used to indicate overdriving of amplifiers has been through use of incandescent bulbs located on the control panel. However, the intermittent on-off usage of said incandescent bulbs in the particular application causes rapid deterioration of the filaments of said bulbs. Use of light-emitting diodes rather than incandescent bulbs is preferable because of the longer life of said diodes. However, if illumination of light-emitting diodes is limited to instantaneous periods of clipping, the flickering light output resulting therefrom is not sufficiently visible to the equipment operator.

SUMMARY OF THE INVENTION

The indicator circuit of this invention is comprised in part of a light-emitting diode which is switched on and off by a parallel-connected switching transistor. The circuit includes a current-limiting resistor, a level-determining means, a bias resistor, and a sensing diode which operate to cause the switching of the light-emitting diode to indicate whether the input signal to an amplifying transistor is of sufficient magnitude that the amplifying transistor is overdriven or close to being overdriven. If the light-emitting diode becomes illuminated by an input signal of sufficient amplitude, an optional capacitor added to the circuit will cause it to remain illuminated for a period of time determined primarily by the time constant associated with the values of said capacitor and the bias resistor. A time-delay resistor may be utilized in conjunction with the indicator circuit to prevent illumination of the light-emitting diode during short duration overdriving signal impulses.

DESCRIPTION OF THE PREFERRED EMBODIMENT

Figure 1:
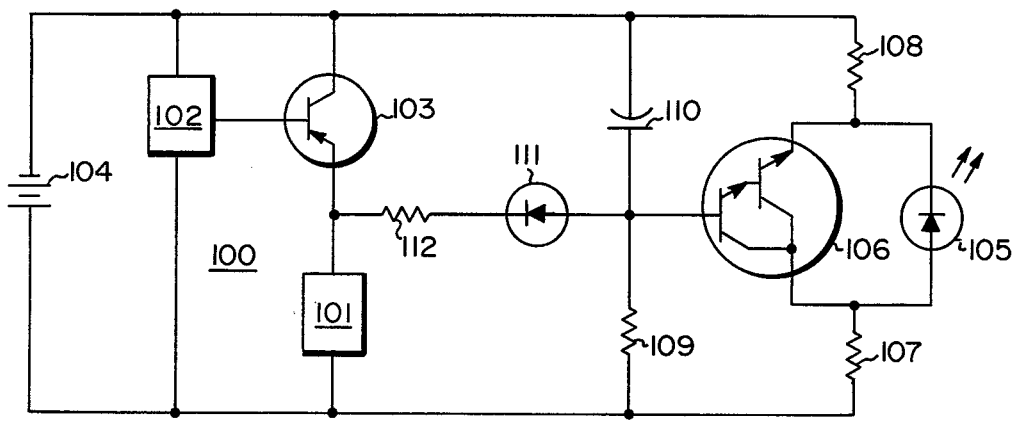
FIG. 1 shows an embodiment of the clipping indicator circuit of this invention as utilized to indicate saturation of an amplifying transistor.
Figure 2:
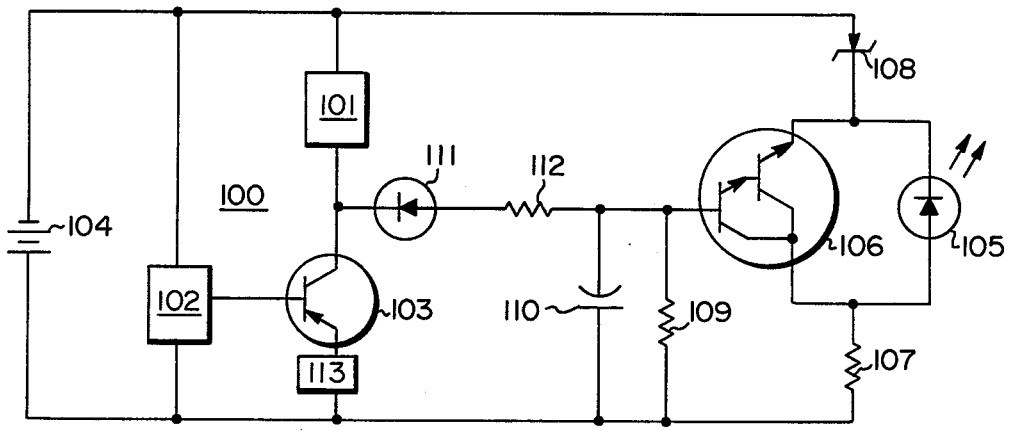
FIG. 2 shows an embodiment of the clipping indicator circuit of this invention as utilized to indicate cut-off of an amplifying transistor.

For a better understanding of the present invention, together with other and further objects, advantages and capabilities thereof, reference is made to the following disclosure in conjunction with the accompanying drawing in which the same numerical designation of similar circuit components is used in both FIGS. 1 and 2.

FIG. 1 of the drawing shows an amplifier 100 in partial block diagram form which may be one half of a class B power amplifier and which may be used to drive an output electromechanical transducer or other energy-absorbing element indicated as load 101. Load 101 may include filtering and/or feedback circuits. Bias and signal means 102 may be comprised of preceding amplifier stages and bias circuitry as well as an input electromechanical transducer or other signal source. Means 102 may also include an operator control for varying the amplitude of the signal input to amplifying transistor 103. Amplifying transistor 103 is shown in FIG. 1 in an emitter-follower circuit in which load 101 is electrically connected between the emitter of said transistor and a first source of fixed direct-current potential, illustrated in said Figure as the positive terminal of direct-current source 104. The collector of amplifying transistor 103 is shown as electrically connected to a second source of fixed direct-current potential, illustrated as the negative terminal of direct-current source 104.

Light-emitting diode 105 is electrically connected in parallel with the collector-emitter path of switching transistor 106 in a manner such that forward conduction of the two elements is directed toward the same terminal. A light-emitting diode is normally fully illuminated with a forward-conducting voltage of approximately 1.5 volts and therefore may be by-passed by a saturated switching transistor. Switching transistor 106 is indicated as a Darlington-connected pair of transistors. The terms collector-emitter path and base-emitter path as used herein to describe switching transistor 106 refer to the external connections of the Darlington-connected pair.

Current-limiting resistor 107 is electrically connected between the first source of fixed direct-current potential, shown as the positive terminal of source 104, and the collector of switching transistor 106. The value chosen must be such that current is sufficient to provide adequate illumination to light-emitting diode 105, yet not exceed specified limits for said diode 105 or switching transistor 106. A 2700-ohm resistor may, for example, be used to limit current when utilized with a 54-volt source and commercially available components.

Level-determining means 108 is electrically connected between the emitter of switching transistor 106 and the second source of fixed direct-current potential, shown as the negative terminal of source 104. Means 108 may be comprised of a resistor, as indicated in FIG. 1, or a zener diode, as indicated in FIG. 2. The voltage across level-determining means 108, as determined by the value of resistance multiplied by the value of current established primarily by current-limiting resistor 107, or as established by a zener diode, substantially fixes a threshold of switching voltage for the switching transistor 106 of FIG. 1. Because the current through a resistor used for level-determining means 108 remains essentially constant whether switching transistor 106 is conducting or non-conducting, switching will take place when the voltage at the emitter of transistor 106 increases above or decreases below the threshold voltage, or when the base-emitter path of transistor 106 is caused to be forward-biased or reverse-biased. For example, using components previously specified, a resistance value of 330 ohms assigned to means 108 will cause switching to take place if the collector-emitter voltage of amplifying transistor 103 decreases below a voltage on the order of 5 volts in magnitude. A zener diode with breakdown voltage of 5 volts could be used for means 108 to accomplish the same result.

Biasing resistor 109 is electrically connected between the base of switching transistor 106 and the first source of fixed direct-current potential shown as the positive terminal of source 104. The value selected for resistor 109 must be such that switching transistor 106 is normally biased in saturation state, and that value may be one megohm using components as described heretofore.

Optional capacitor 110 may be electrically connected to the base of switching transistor 106 and to a source of fixed direct-current potential, which may be the negative terminal of source 104 as indicated in FIG. 1 or the positive terminal of source 104 as indicated in FIG. 2, or any other fixed potential voltage source available. In the circuit configuration shown in FIG. 1, optional capacitor 110 is discharged during clipping intervals through sensing diode 111, which is shown as electrically connected between the base of switching transistor 106 and the junction in the series connection of transistor 103 and load 101. Optional delay resistor 112 may be connected in series with sensing diode 111 for purpose to be discussed in a later paragraph herein.

In further explanation of the operation of the circuit of FIG. 1, it is first assumed that there is no signal input from means 102 applied to the base of amplifying transistor 103. Under that condition, switching transistor 106 is caused to be in saturated state by base input current from bias resistor 109 and, therefore, light-emitting diode 105 is not illuminated. The base-emitter path of switching transistor 106 is forward-biased. Therefore the voltage across optional capacitor 110 is slightly greater in magnitude than the threshold voltage across level-determining means 108.

If it is then assumed that the signal input from means 102 drives the collector-emitter voltage of amplifying transistor 103 to a value such that said voltage is less in magnitude than the voltage across means 108 sensing diode 111 will cause the base-emitter path of switching transistor 106 to be reverse-biased and therefore switching transistor 106 will be switched to its non-conducting state. Optional capacitor 110, if used, will simultaneously be discharged through sensing diode 111, thereby causing the magnitude of the voltage across said capacitor 110 to decrease to a lower value than the value of threshold voltage established by means 108. Switching transistor 106 will remain in its non-conducting state and, therefore, light-emitting diode 105 will remain illuminated until such time as optional capacitor 110 is recharged through bias resistor 109 to its previous voltage level, at which time switching transistor 106 will revert to its saturated state. The charging time constant is determined by the values assigned to bias resistor 109 and optional capacitor 110 and those values may be chosen such that light-emitting diode 105 remains continually illuminated long enough for an inattentive observer to view the overdriving indication, keeping in mind that occasional overdriving occurs during normal operation. Continued overdrive or near-overdrive of amplifying transistor 103 will not, of course, permit optional capacitor 110 to be recharged and light-emitting diode 105 will remain illuminated. A suitable value for capacitor 110 is 0.22 microfarads when used in conjunction with values of components previously described for use in an audio amplifier.

Optional delay resistor 112 substantially determines, in conjunction with optional capacitor 110, the time constant for discharge of said capacitor 110 through sensing diode 111 during intervals of transistor saturation or near-saturation. Therefore, delay resistor 112 may be used to effectively prevent activation or illumination of light-emitting diode 105 except during extended intervals of overdriving or near-overdriving signal. For example, delay resistor 112 may have a value of 100 ohms for use with circuit components as described heretofore.

While the embodiment of the invented circuit as illustrated in FIG. 1 is applied to indicate saturation and near-saturation of an emitter-follower amplifier, it is obvious to those who are skilled in the art to which the invention pertains that the same circuit may be used to indicate saturation and near-saturation by the parallel connection of the series connection of diode 111, base-emitter path of transistor 106 and resistor 108 with the collector-emitter path of any amplifying transistor used in circuits other than those of the described emitter-follower type. It is similarly obvious that the circuit of this invention may be used to indicate cut-off and near cut-off condition of a transistor by connecting the aforesaid series elements in parallel with the transistor load element or elements, assuming that said load element or elements operate in series with said transistor, as for example by the interchange of elements 101 and 103 as indicated in FIG. 2. Amplifier circuit 100 may include a feedback-bias means 113 for the purpose of feedback and/or bias. The indicator circuit of this invention is, however, generally limited to use with amplifier circuits with output impedances at least one order in magnitude lower than the input impedance of said indicator circuit. It is also obvious that a single circuit of this invention may, by use of additional sensing diodes 111, be used to sense saturation or cut-off condition in more than one load or transistor, provided that the additional loads or transistors have a common terminal or voltage reference level and have the same direct-current polarity at opposing terminals with respect to said terminal or reference level.

It is also noted that optional delay resistor 112 may be required in certain applications for the purpose of limiting current through sensing diode 111 or for the purpose of increasing the input impedance of the indicator circuit rather than for the purpose of delaying switching.

While there has been shown and described what is at present considered the preferred embodiment of the invention it will be obvious to those skilled in the art that various changes and modifications may be made therein without departing from the invention as defined by the appended claims.

What I claim is:

1. A clipping indicator circuit for use in conjunction with a transistor amplifier, said amplifier being comprised of an amplifying transistor with a collector-emitter path, a load electrically connected in series with said collector-emitter path, at least a first and second source of d-c potential between which sources said series connected load and collector-emitter path are electrically connected such that said collector-emitter path forwardly conducts from first to second potential source, and a bias and input signal means coupled to said sources and to the base of said transistor, said circuit further comprising:

- a switching transistor with a collector-emitter path and a base-emitter path;
- a light-emitting diode electrically connected in parallel with the collector-emitter path of said switching transistor and having forward conducting path directed parallel to the forward conduction of said collector-emitter path of said switching transistor;
- a current-limiting resistor electrically connected between said first source of electrical potential and the collector of said switching transistor;
- a level-determining means electrically connected between said second source of electrical potential and the emitter of said switching transistor;
- a bias resistor electrically connected between said second source of electrical potential and the base of said switching transistor; and
- a sensing diode electrically connected between said base of said switching transistor and a junction in said series connection between said load and said collector-emitter path of said amplifying transistor.

2. The clipping indicator circuit of claim 1 in which a capacitor is electrically connected between said base of said switching transistor and one of said sources of direct-current potential.

3. The clipping indicator circuit of claim 2 in which a delay resistor is electrically connected in series with said sensing diode.

4. The clipping indicator circuit of claim 1 in which said level-determining means is comprised of a resistor.

5. The clipping indicator circuit of claim 1 in which said level-determining means is comprised of a zener diode.

6. The clipping indicator circuit of claim 1 in which said switching transistor is further comprised of a Darlington-connected pair of transistors.

7. The clipping indicator circuit of claim 1 used in conjunction with said transistor amplifier, said transistor circuit further comprised of a feedback-bias means electrically connected between said amplifying transistor and said first source.

* * * * *